United States Patent
Bao

(10) Patent No.: US 9,680,023 B1
(45) Date of Patent: Jun. 13, 2017

(54) METHOD OF MANUFACTURING A DUAL-GATE FINFET

(71) Applicant: Yu Bao, Shanghai (CN)

(72) Inventor: Yu Bao, Shanghai (CN)

(73) Assignee: SHANGHAI HUALI MICROELECTRONICS CORPORATION, Shanghai (CN)

( * ) Notice: Subject to any disclaimer, the term of this patent is extended or adjusted under 35 U.S.C. 154(b) by 0 days.

(21) Appl. No.: 15/235,124

(22) Filed: Aug. 12, 2016

(30) Foreign Application Priority Data

Mar. 22, 2016 (CN) .......................... 2016 1 0163777

(51) Int. Cl.
  *H01L 27/108* (2006.01)
  *H01L 29/78* (2006.01)
  *H01L 29/40* (2006.01)
  *H01L 29/66* (2006.01)

(52) U.S. Cl.
  CPC ........ *H01L 29/7855* (2013.01); *H01L 29/401* (2013.01); *H01L 29/66545* (2013.01); *H01L 29/66795* (2013.01)

(58) Field of Classification Search
  CPC . H01L 51/5206; H01L 51/5092; H01L 51/56; H01L 51/5072; H01L 27/3276; H01L 27/108
  See application file for complete search history.

(56) References Cited

U.S. PATENT DOCUMENTS

| | | | |
|---|---|---|---|
| 2004/0235300 A1* | 11/2004 | Mathew | H01L 27/115 438/689 |
| 2009/0108351 A1* | 4/2009 | Yang | H01L 27/108 257/347 |

* cited by examiner

*Primary Examiner* — Kyoung Lee
*Assistant Examiner* — Christina Sylvia
(74) *Attorney, Agent, or Firm* — Tianchen LLC

(57) ABSTRACT

A method of manufacturing a dual-gate FinFET is provided. The method includes: forming a fin structure on the semiconductor substrate, depositing an oxide layer and planarizing until the top of the fin structure is exposed, depositing a hard mask layer and patterning, preforming a first etch back process to one side of the oxide layer, and then removing the rest of the hard mask layer, preforming a second etch back process to the oxide layers at both sides of the fin structure simultaneously, forming a gate dielectric layer on surface of the fin structure, then depositing gate material on the gate dielectric layer and patterning, removing gate material on top of the fin structure, forming a drive gate and a control gate at two sides of the fin structure respectively; wherein height of the control gate is higher than height of the drive gate.

10 Claims, 3 Drawing Sheets

METHOD OF MANUFACTURING A DUAL-GATE FINFET

CROSS-REFERENCE TO RELATED APPLICATION

This application claims the priority benefit of Chinese Patent Application Serial No. 201610163777.9, filed Mar. 22, 2016. All disclosure of the Chinese application is incorporated herein by reference.

FIELD OF THE INVENTION

The present invention generally relates to the field of semiconductor manufacturing technology, more particularly, to a method of manufacturing a dual-gate FinFET.

BACKGROUND OF THE INVENTION

As integrated circuit technologies continue to advance to nanometer technology node, there are continuing efforts to increase density and performance, and reduce costs. Manufacturers in the field have begun to consider the transition from three-dimensional planar complimentary metal-oxide-semiconductor (CMOS) transistor structures to fin field effect transistor (FinFET) structures. The FinFET is a new CMOS transistor, which can adjust threshold voltage (Vth) of the device, further reduce static power consumption. Compared with the planar transistor, the FinFET structures have improved control of the channel, thereby reducing short channel effect.

Currently, the FinFET structures may generally include three-terminal FinFET (3T-FinFET) structures and four-terminal FinFET (4T-FinFET) structures. Wherein, the 3T-FinFET structure includes three terminals, which is a source, a drain and a gate across the fin of the 3T-FinFET, the source and the drain locate at opposing ends of the fin. Since three sides of the fin are controlled by the gate, which would have a better control to carriers in active region and provide greater drive current than that of conventional MOS structures, thereby improving the device performance and the 3T-FinFET structure has been widely used. the 4T-FinFET (dual-gate FinFET) structure includes four terminals, a source, a drain and two separated gates on each side of the fin respectively, which is a drive gate and a control gate, the source and the drain locate at opposing ends of the fin. The channel current of the fin can be controlled by the two gates independently, and the threshold voltage of the drive gate can effectively be changed by adjusting size of the control gate, to improve device performance. Therefore, in practical applications, a low current leakage of core logic circuit would be requires for the dual-gate FinFET.

The difference of the 4T-FinFET and the 3T-FinFET is that, the 4T-FinFET has two independent gates. Therefore, in the production of the 4T-FinFET, there is a process in prior art to separate two gates of the 4T-FinFET. However, the height of the formed driving gate and the control gate after such process are the same, which make it difficult to further reduce the leakage current at the bottom of effective channel.

BRIEF SUMMARY OF THE DISCLOSURE

Accordingly, an objective of the present invention is to provide a method of manufacturing a dual-gate FinFET, which can make the height of driving gate and control gate are not the same, so as to reduce the leakage current at the bottom of effective channel of the dual-gate FinFET.

The method of manufacturing a dual-gate FinFET provided by the present invention includes the following steps:

step S01: providing a semiconductor substrate, forming a fin structure on the semiconductor substrate;

step S02: depositing an oxide layer to cover the fin structure, and then planarizing until the top of the fin structure is exposed;

step S03: depositing a hard mask layer to cover the oxide layer and the fin structure, and then patterning to expose the oxide layer at one side of the fin structure;

step S04: preforming a first partially etch back process to the oxide layer of the exposed side, and then removing the rest of the hard mask layer, exposing the oxide layer of the other side, next preforming a second partially etch back process to the oxide layers at both sides of the fin structure simultaneously, therefore, the oxide layers at two sides of the fin structure having a height difference;

step S05: forming a gate dielectric layer on the surface of the fin structure, then depositing a gate material on the gate dielectric layer and patterning;

step S06: removing the gate material on top of the fin structure, forming a drive gate and a control gate at two sides of the fin structure respectively; wherein height of the control gate is higher than height of the drive gate.

Preferably, in step S03, firstly, depositing a protective layer on the top of the fin structure as a etch stop layer when preforming the etch back processes, and then depositing a hard mask layer.

Preferably, the material of the protective layer includes SiN or SiON.

Preferably, the hard mask layer and the protective layer are made out of same material.

Preferably, the material of the hard mask layer includes SiN.

Preferably, the height difference between the oxide layers at two sides of the fin structure is not less than 1 nm.

Preferably, the height difference between the oxide layers at two sides of the fin structure is not less than 3 nm.

Preferably, the gate material includes a poly-SiON material or a high-K metal gate (HKMG) material.

Preferably, the material of the oxide layer includes silicon oxide.

Preferably, the material of the gate dielectric layer includes silicon oxide.

From the above technical solution, in the present invention, by preforming two etch back processes, a height difference between oxide layer at two sides of fin structure of a FinFET is formed, therefore the drive gate and the control gate formed at the two sides of the fin structure respectively in later process would also have a height difference. By controlling the height of the control gate is higher than the height of the drive gate, the leakage current at the bottom of effective channel in a dual-gate FinFET structure would be reduced.

DETAILED DESCRIPTION OF THE EMBODIMENTS

The embodiments of the present invention will now be described more fully hereinafter with reference to the accompanying drawings.

The embodiments are intended to describe aspects of the invention in sufficient detail to enable those skilled in the art to practice the invention. Other embodiments can be utilized and changes can be made without departing from the scope of the present invention. The following detailed description is, therefore, not to be taken in a limiting sense. The scope of the present invention is defined only by the appended claims, along with the full scope of equivalents to which such claims are entitled.

Figure 1:
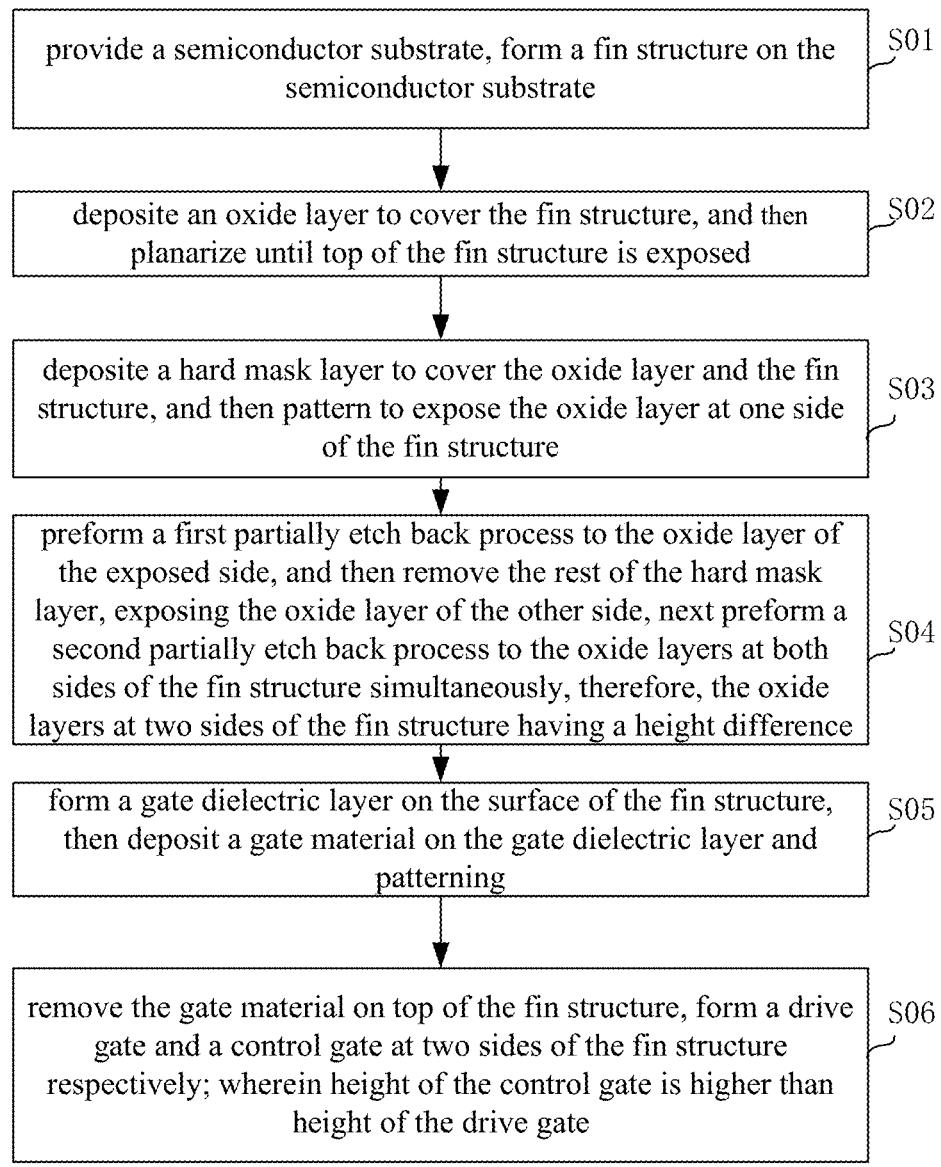
FIG. 1 is a flow chart illustrating the method of manufacturing a dual-gate FinFET

In the following embodiments, please referring to FIG. 1, FIG. 1 is a flow chart illustrating the method of manufacturing a dual-gate FinFET; please also referring to FIGS. 2 to 7, FIGS. 2 to 7 are structural schematic diagrams illustrating the steps of manufacturing a f a dual-gate FinFET based on the method of FIG. 1 according to one embodiment of the present invention. As shown in FIG. 1, the method of manufacturing a dual-gate FinFET includes the following steps:

step 01: providing a semiconductor substrate, forming a fin structure on the semiconductor substrate.

Figure 2:
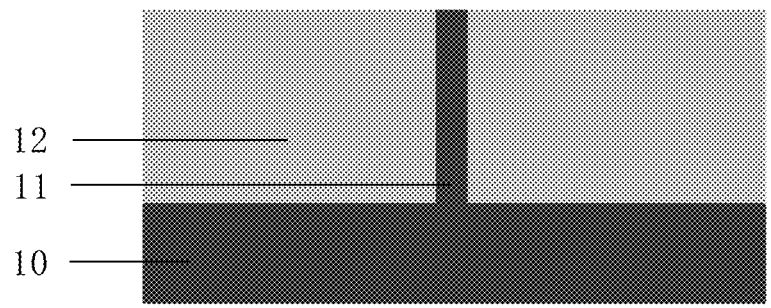
FIGS. 2 to 7 are structural schematic diagrams illustrating the steps of manufacturing a dual-gate FinFET based on the method of FIG. 1 according to one embodiment of the present invention
Figure 3:
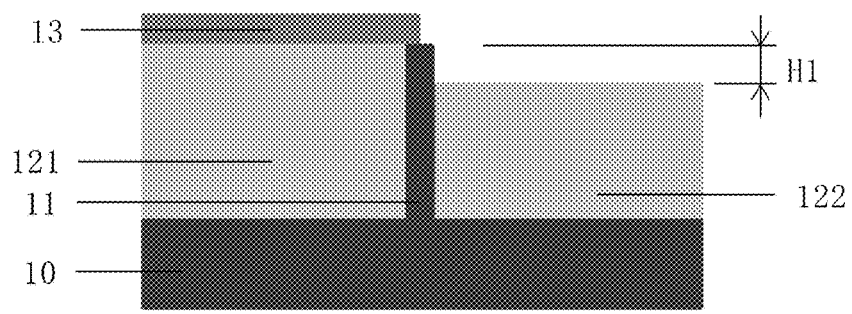

Please referring to FIG. 2, the semiconductor substrate in the embodiment of the present invention is a silicon wafer 10, firstly a fin structure 11 of a FinFET is formed on the silicon wafer 10 by using existing technology. Such fin structure 11 could be one or more. In this embodiment, one fin structure is used to illustrating the method of manufacturing a dual-gate FinFET according to the present invention step 02: depositing an oxide layer to cover the fin structure, and then planarizing until the top of the fin structure is exposed;

Please continue referring to FIG. 2, an oxide layer is deposited on the silicon wafer 10 by using a process such as CVD. The oxide layer could be a silicon oxide layer 12, completely coving the fin structure 11. Then the silicon oxide layer 12 is planarized until the top of the fin structure 11 is exposed, the planarizing process could be a CMP. The silicon oxide layer includes silicon oxide layer at the left side 121 and silicon oxide layer at the right side 122 of the fin structure.

step S03: depositing a hard mask layer to cover the oxide layer and the fin structure, and then patterning to expose the oxide layer at one side of the fin structure;

Referring to FIG. 3, a hard mask layer 13 is deposited by using conventional process, completely covering the silicon oxide layer 12 and the fin structure 11. Then the hard mask layer 13 is patterned by photolithography and etching to expose the silicon oxide layer at one side 122 (right side in FIG. 3) of the fin structure. The silicon oxide layer at right side 122 is used for forming control gate in later process.

In one preferred embodiment, firstly, a protective layer is deposited on the top of the fin structure 11 (not shown in figure) as a etch stop layer for later process, and then a hard mask layer 13 is deposited. The material of the protective layer includes but not limited to SiN or SiON. Furthermore, the hard mask layer 13 and the protective layer can made out of same material, such as SiN; the hard mask layer 13 could also use other materials, such as amorphous carbon.

step S04: preforming a first partially etch back process to the oxide layer of the exposed side, and then removing the rest of the hard mask layer, exposing the oxide layer of the other side, next preforming a second partially etch back process to the oxide layers at both sides of the fin structure simultaneously, therefore, the oxide layers at two sides of the fin structure having a height difference;

Please continue referring to FIG. 3, subsequently, a first partially etch back process is preformed, wherein, the patterned hard mask layer 13 is shielding the silicon oxide layer at the left side 121, therefore, the first partially etch back process is preformed to the exposed the silicon oxide layer at the right side 122, a portion of the silicon oxide layer at the right side 122 is removed, so that the silicon oxide layer at the right side 122 is lower than the silicon oxide layer at the left side 121, with a height difference of H1.

Figure 4:
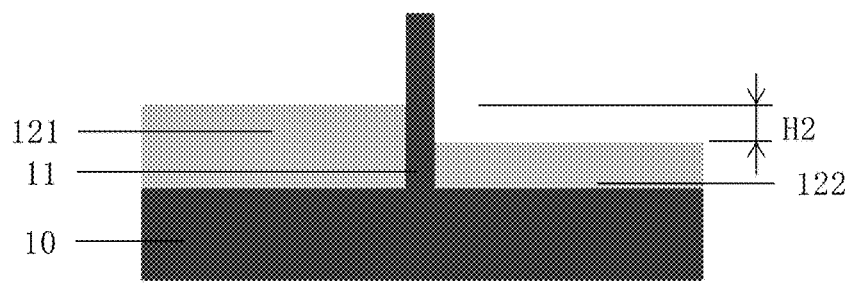

Referring to FIG. 4, subsequently, the rest of the hard mask layer is removed, exposing the silicon oxide layer at the left side 121 of the fin structure. Then, a second partially etch back process is preformed to the silicon oxide layer at the left side 121 and the silicon oxide layer at the right side 122 of the fin structure simultaneously. Height difference between the silicon oxide layer at the right side 122 and the silicon oxide layer at the left side 121 is H2 after the second partially etch back process. Under the same amount of etching, the height difference H2 is considered to be the same as the height difference H1. As shown in FIG. 4, the silicon oxide layer at the left side 121 is higher than the silicon oxide layer at the right side 122, such height difference H2 should not less than 1 nm. In a preferred embodiment, the height difference H2 of the oxide layers at two sides of the fin structure should not less than 3 nm.

Figure 5:
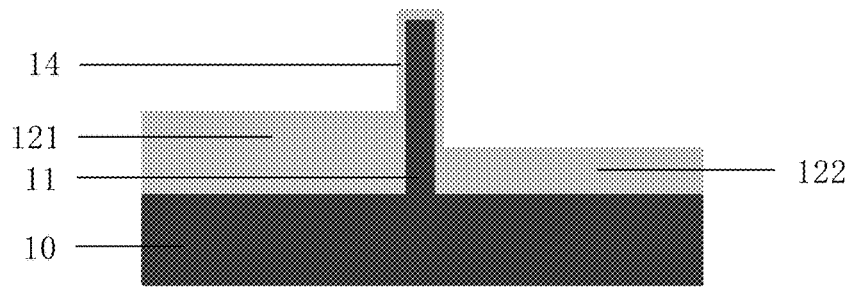

The protective layer on the top of the fin structure is used a etch stop layer, providing protection to the fin structure.

step S05: forming a gate dielectric layer on the surface of the fin structure, then depositing a gate material on the gate dielectric layer and patterning;

Referring to FIG. 5, subsequently, a gate dielectric layer material is deposited and patterned on exposed surface of the fin structure 11, so as to form a gate dielectric layer (GOX) 14. The gate dielectric layer material could be the same as the oxide layer, such as silicon oxide.

Figure 6:
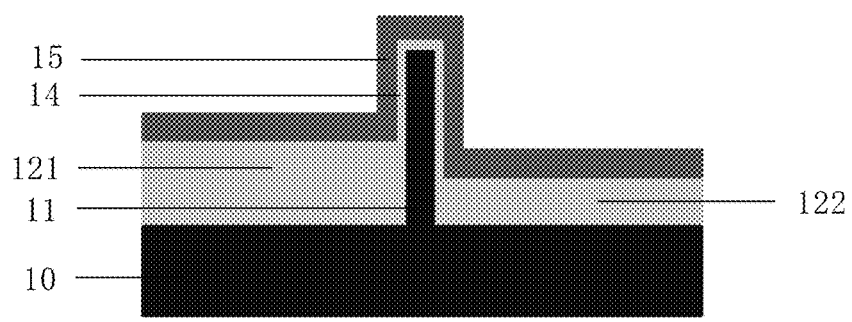

Please referring to FIG. 6, subsequently, a gate material is deposited and patterned on the gate dielectric layer, a gate structure 15 crossing the fin structure is formed, such FinFET device is a three-terminal FinFET (3T-FinFET) structure. As shown in FIG. 6, the height difference between the gate structure 15 at the right side and the left side of the fin structure 11 after the gate material is deposited and patterned is corresponding to the height difference H2 of the oxide layers at two sides of the fin structure.

step S06: removing the gate material on top of the fin structure, forming a drive gate and a control gate at two sides of the fin structure respectively; wherein height of the control gate is higher than height of the drive gate.

Figure 7:
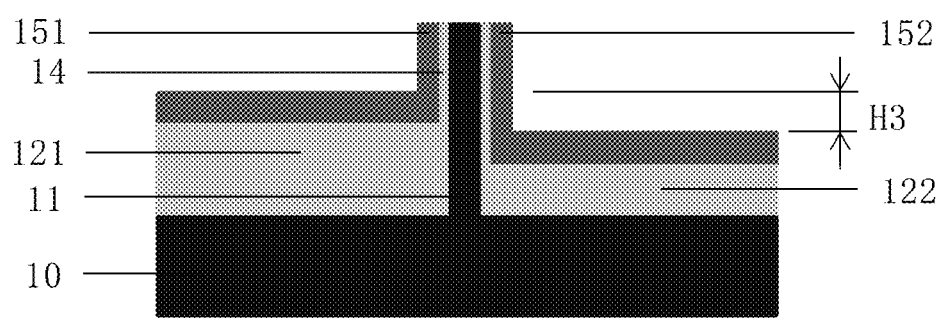

Referring to FIG. 7, subsequently, in order to form the four-terminal FinFET (4T-FinFET), the gate material on top of the fin structure is needed to be removed, so as to form a mutual independent dual-gate FinFET structure at two sides of the fin structure. In the embodiment, any kinds of the conventional processes could be used to remove the portion of the gate material on the top of the fin structure, such conventional processes could be but not limited to CMP or photolithography.

After the gate material on the top of the fin structure is removed, as shown in FIG. 7, an independent drive gate 151 and an independent control gate 152 are formed at two sides of the fin structure respectively, and the formed control gate 152 is higher than the formed drive gate 151 with a height difference of H3. Such height difference H3 could further reduce leakage current at bottom of effective channel in the dual-gate FinFET structure. The height difference H3 between the control gate 152 and the drive gate 151 is not limited in the present invention.

The new method according to the present invention can be used to manufacture poly-SiON or high-K metal gate (HKMG) dual-gate FinFET structures.

In the present invention, by preforming two etch back processes, a height difference between the silicon oxide layer at the left side 121 and the silicon oxide layer at the right side 122 of fin structure is formed, such that the drive gate and the control gate formed at the two sides of the fin structure respectively in later process would also have a height difference. By controlling the height of the control gate is higher than the height of the drive gate, to reduce leakage current at the bottom of effective channel in a dual-gate FinFET structure.

While this invention has been particularly shown and described with references to preferred embodiments thereof, if will be understood by those skilled in the art that various changes in form and details may be made herein without departing from the spirit and scope of the invention as defined by the appended claims.

The invention claimed is:

1. A method of manufacturing a dual-gate FinFET includes the following steps:
   step S01: providing a semiconductor substrate, forming a fin structure on the semiconductor substrate;
   step S02: depositing an oxide layer to cover the fin structure, and then planarizing until the top of the fin structure is exposed;
   step S03: depositing a hard mask layer to cover the oxide layer and the fin structure, and then patterning to expose the oxide layer at one side of the fin structure;
   step S04: preforming a first partially etch back process to the oxide layer of the exposed side, and then removing the rest of the hard mask layer, exposing the oxide layer of the other side, next preforming a second partially etch back process to the oxide layers at both sides of the fin structure simultaneously, therefore, the oxide layers at two sides of the fin structure having a height difference;
   step S05: forming a gate dielectric layer on the surface of the fin structure, then depositing a gate material on the gate dielectric layer and patterning;
   step S06: removing the gate material on top of the fin structure, forming a drive gate and a control gate at two sides of the fin structure respectively; wherein height of the control gate is higher than height of the drive gate.

2. The method of manufacturing a dual-gate FinFET according to claim 1, wherein in step S03, firstly, depositing a protective layer on the top of the fin structure as a etch stop layer when preforming the etch back processes, and then depositing a hard mask layer.

3. The method of manufacturing a dual-gate FinFET according to claim 2, wherein the material of the protective layer includes SiN or SiON.

4. The method of manufacturing a dual-gate FinFET according to claim 2, wherein the hard mask layer and the protective layer are made out of same material.

5. The method of manufacturing a dual-gate FinFET according to claim 1, wherein the material of the hard mask layer includes SiN.

6. The method of manufacturing a dual-gate FinFET according to claim 1, wherein the height difference between the oxide layers at two sides of the fin structure is not less than 1 nm.

7. The method of manufacturing a dual-gate FinFET according to claim 6, wherein the height difference between the oxide layers at two sides of the fin structure is not less than 3 nm.

8. The method of manufacturing a dual-gate FinFET according to claim 1, wherein the gate material includes a poly-SiON material or a high-K metal gate (HKMG) material.

9. The method of manufacturing a dual-gate FinFET according to claim 1, wherein the material of the oxide layer includes silicon oxide.

10. The method of manufacturing a dual-gate FinFET according to claim 1, wherein the material of the gate dielectric layer includes silicon oxide.

\* \* \* \* \*